United States Patent [19]

Tamaki et al.

[11] Patent Number: 4,635,090
[45] Date of Patent: Jan. 6, 1987

[54] TAPERED GROOVE IC ISOLATION

[75] Inventors: Yoichi Tamaki; Tokuo Kure, both of Kokubunji; Akira Sato, Hachioji; Hisayuki Higuchi, Kokubunji, all of Japan

[73] Assignee: Hitachi, Ltd., Tokyo, Japan

[21] Appl. No.: 733,406

[22] Filed: May 13, 1985

Related U.S. Application Data

[63] Continuation of Ser. No. 303,133, Sep. 17, 1981, abandoned.

[30] Foreign Application Priority Data

Sep. 17, 1980 [JP] Japan .................. 55-127987
Jul. 8, 1981 [JP] Japan .................. 56-105574
Aug. 19, 1981 [JP] Japan .................. 56-128760

[51] Int. Cl.⁴ .................. H01L 27/04; H01L 21/302
[52] U.S. Cl. .................. 357/50; 148/DIG. 51; 148/DIG. 85; 148/DIG. 161; 148/DIG. 168; 357/55; 357/54; 357/60
[58] Field of Search .................. 357/50, 55, 56, 54, 357/60

[56] References Cited

U.S. PATENT DOCUMENTS

| | | | |
|---|---|---|---|
| 3,900,350 | 8/1975 | Appels et al. | 357/50 |
| 3,980,508 | 9/1976 | Takamiya et al. | 357/55 |
| 4,104,086 | 8/1978 | Bondur et al. | 357/50 |
| 4,104,090 | 8/1978 | Pogge | 357/50 |
| 4,240,095 | 12/1980 | Rosetti | 357/55 |
| 4,309,716 | 1/1982 | el-Kareh | 357/50 |

OTHER PUBLICATIONS

Forget et al., IBM Tech. Discl. Bulletin, vol. 22, No. 11, Apr. 1980, p. 4886.

Primary Examiner—William D. Larkins
Attorney, Agent, or Firm—Antonelli, Terry & Wands

[57] ABSTRACT

A semiconductor device and the method of manufacturing the same are disclosed, the semiconductor device having a plurality of elements isolated by a groove having a gentle slope at the upper side wall, and a steep slope at the lower side wall. This groove provides low steps on its mouth and occupies a small area on the substrate, thus enabling an extremely high-density integrated circuit to be formed.

23 Claims, 16 Drawing Figures

TAPERED GROOVE IC ISOLATION

This application is a continuation of application Ser. No. 303,133, filed Sept. 17, 1981, now abandoned.

This invention relates to a semiconductor device and a method of manufacturing the same, and particularly to a semiconductor device having elements formed in a surface region of a semiconductor substrate to be isolated by a groove having a gentle slope at its upper side wall and a steep slope at its lower side wall, and a method of manufacturing such semiconductor device with ease and high precision.

In the semiconductor integrated circuit including a number of active and passive elements such as transistors, diodes and resistors within a semiconductor substrate, it is necessary to electrically isolate these elements each other.

To electrically isolate the elements formed in a substrate, there have been proposed some methods of which the pn junction isolation is most widely used.

In this pn junction isolation, the pn junction provides a high resistance when reverse biased, thus being effective to isolate adjacent elements.

This pn junction isolation has most widely been used for isolation of elements in a semiconductor device, but it has drawbacks of requiring a large area, causing a large parasitic capacitance and so on so that it is difficult to be used for a high-density integrated semiconductor device.

To solve this problem, the dielectric isolation method has been proposed.

In this method, a groove of a U- or V-shape section is formed in a semiconductor substrate to isolate elements formed therein. In this case, following two processes are used: (1) only an insulating material is used to fill the groove, or (2) an insulating layer is deposited on the side walls and bottom wall of the groove and then insulating material, polycrystalline silicone or amorphous silicon is filled in the groove (hereinafter, the isolation using such a groove is called a U-groove or V-groove isolation).

This dielectric isolation requires a small area, and provides a small parasitic capacitance and a large dielectric resistance, and so on, as compared with the pn junction isolation. In spite of these advantages, this dielectric isolation has the following problems to be solved.

To achieve the U-groove isolation, as shown in FIG. 1a, a U-shaped groove 2 is first formed in a semiconductor substrate 1, an insulating film 3 and a polycrystalline silicon film 4, for example, are deposited over the substrate 1 by a well known process such as CVD (chemical vapor deposition), and then an unnecessary part of the insulating film 3 and polycrystaline silicon film 4 is etched away.

At this time, in order to completely remove the insulating film 3 and polycrystalline silicon 4 deposited on the surface of the semiconductor substrate 1 excepting those in the groove, it is necessary to perform the above etching somewhat excessively.

However, such excessive etching will remove part of the insulating film 3 and polycrystalline silicon film 4, within the groove 2 to a depth somewhat lower than the surface of the semiconductor substrate 1 so as to form a sharp step 5 of about right angle at the edges of the groove 2 as shown in FIG. 1b.

Therefore, if a conductor for interconnection is formed on the substrate 1 across the groove 2, the interconnnection conductor will easily be broken at the sharp step 5. Thus, it is difficult to build up a high-reliability integrated circuit with use of this dielectric isolation technique.

If a groove of a V-shaped section is formed in the substrate 1, the step 5 becomes round at the edges of the groove 2, thus reducing the probability of braking the conductor at the groove as compared with the U-shaped groove. However, the V-shaped groove occupies more area, which is apparently not suited for the large-scale integrated circuit.

Accordingly, it is an object to provide a semiconductor device with the above drawback obviated and the elements of which are isolated by a groove occupying a small area, providing a small parasitic capacitance and causing no breaking of conductor at its step, and a method of manufacturing the same.

To this end, this invention employs a groove having a gentle slope at its upper side wall and a steep slope at its lower side wall for the purpose of isolating the elements in the substrate.

This invention will be described in detail with reference to the attached drawings, in which:

FIG. 2 is a cross-sectional view of one embodiment of this invention.

Figure 1A:
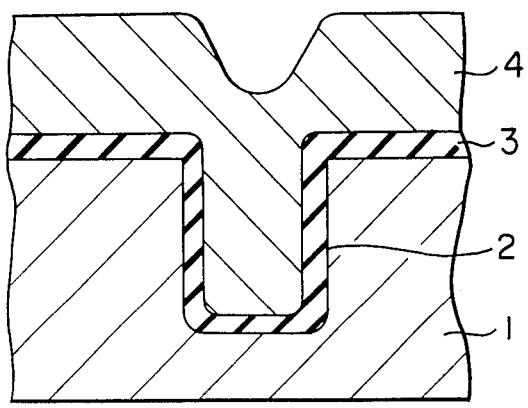
FIGS. 1a and 1b are cross-sectional views of a semiconductor substrate to which reference is made in explaining the conventional U-groove isolation.
Figure 1B:
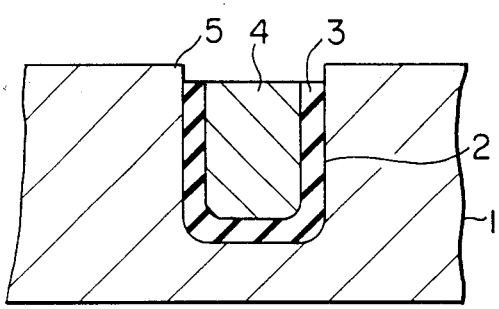
Figure 2:
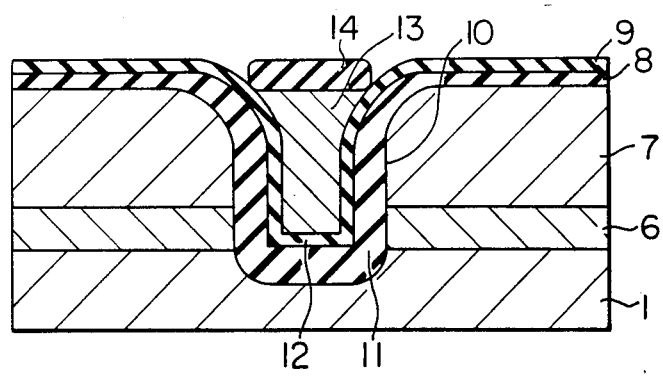
FIG. 2 is a cross-sectional view of an example of the Y-groove for isolation of elements used in this invention.

As shown in FIG. 2, this invention employs a groove of a Y-shaped section having a gentle slope on the upper side wall and a steep slope on the lower side wall in order to isolate elements (such isolation is called Y-groove isolation in this specification).

Specifically, on the (100) oriented silicon substrate 1 is formed a collector buried layer 6 by a well known method, and on the buried layer 6 is formed a single crystal silicon layer 7 for the active region of a transistor by the well known vapour phase epitaxial growth process. Subsequently, a $SiO_2$ film 8 and a $Si_3N_4$ film 9 are sequentially formed thereon by the known thermal oxidizing process and CVD process.

Then, by the method as will be described in detail later, is formed a groove 10 of Y-shaped cross-section having a gentle slope on the upper side wall and a steep slope on the lower side wall, and on the surface of the groove 10 are formed a $SiO_2$ film 11 and a $Si_3N_4$ film 12 in turn. Thereafter, a polycrystalline silicon 13 is filled in the groove and subsequently a $SiO_2$ film 14 is formed on the polycrystalline silicon 13 to flatten its surface.

The Y-groove isolation, as shown in FIG. 2, causes no steep step because the slope on the upper side wall of the groove 10 is gentle. Thus, even if conductors for interconnection are formed to run across the gap of the groove 10, the conductors are almost not broken at the gap.

Moreover, the steep slope on the lower side wall of the groove 10 is advantageous to greatly reduce the surface area (geometry) necessary for isolation as compared with the V-groove isolation which uses the V-groove having only gentle slope on the side wall.

In accordance with this invention, it is possible to achieve both the prevention of breaking of conductors and reduction of the necessary area, which are particularly useful for making large-scale integrated circuits.

While in this embodiment the two insulating films of $SiO_2$ 11 and $Si_3N_4$ 12 are formed over the surface of the groove 10 and then the polycrystalline silicon 13 is filled in the groove 10, other various modifications can be made in this invention.

For example, the insulating films deposited on the surface of the groove 10 may be $Al_2O_3$ film, photosilicate glass film or other insulating films instead of the $SiO_2$ film 11 and $Si_3N_4$ film 12.

In addition, two layers are not always necessary for the insulating films 11 and 12 on the surface of the groove 10, but one layer or three layers or more can be used for the insulating films 11 and 12.

Furthermore, the insulating films are not necessary to be covered over the entire surface of the groove. As long as the insulating film or films are covered over the side wall, the bottom wall of the groove is not necessary to have any insulating film thereon. Even if the polycrystalline silicon 13 is made in direct contact with the bottom surface of the groove 10, there is no trouble in the isolation of elements.

In this embodiment as shown in FIG. 2, the insulating films 11 and 12 and polycrystalline silicon 13 are filled in the groove 10. To prevent the stress within the semiconductor substrate, the way according to this embodiment is most suitable. But, an insulating material such as $SiO_2$ may be used instead of polycrystalline silicon, which provides excellent isolation characteristics. The insulating material such as $SiO_2$ may be applied after the deposition of $SiO_2$ film 11 and $Si_3N_4$ film 12 over the inside wall of the groove 10, or it may be directly applied in the groove 10 to fill the groove with only the insulator such as $SiO_2$.

In accordance with this invention, the groove having a gentle slope on the upper side wall and a steep slope on the lower side wall is formed to isolate the elements built up on the surface region of the semiconductor substrate 1, and these slopes can take different angles.

In plactice, it will be most preferable to take the upper and lower slopes of about 30° to 65° and about 70° to 90°, respectively.

If the upper slope of the groove 10 (angle of the upper side wall relative to the main surface of the semiconductor substrate 1) is about 65° or above, the conductor for interconnection formed across the groove 10 will easily be broken. If the slope is about 30° or below, the breaking of the conductor can be prevented most satisfactorily, but the necessary area for the formation the groove 10 is so large as to loose one of the advantages of the invention.

Moreover, if the lower slope of the groove 10 is about 90° or above, an insulating material or polycrystalline silicon becomes difficult to fill in the groove 10 with high density, and hollows or cavities are easily caused therein. If the lower slope is 70° or below, the necessary area becomes very large.

Moreover, if polycrystalline silicon 13 is buried in the groove 10 for the purpose of isolation, oxidation of the surface of the polycrystalline silicon 13 will provide a large stress, which is lightened by a small-angle slope of the upper side wall of the groove 10. Consequently, the generation of crystal defect can be prevented within the silicon substrate 1, and the prevention effect is great when the upper slope is 65° or below.

From the above reasons, in practice, the upper and lower slopes are preferably selected to be about 30° to 65° and about 70° to 90°, respectively.

In addition, if the depth of the upper slope of the groove is about 1 μm or above, the necessary area is increased to loose the small area effect, whereas if the depth thereof is about 0.2 μm or below, the conductor thereacross is easily broken. Therefore, the depth of the upper gentle slope of the groove is preferably about 0.2 to 1 μm.

EMBODIMENT 1

This embodiment shows a bipolar integrated circuit to which this invention is applied.

Figure 3A:
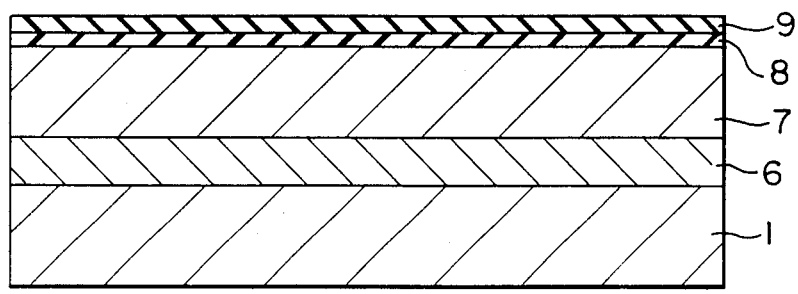
FIGS. 3a to 3d are a flow diagram of one embodiment of the invention.

Referring to FIG. 3a, on the (100) oriented Si substrate 1 is formed the collector buried layer 6 by a known method, and on the layer 6 is formed the Si epitaxial layer 7 for the active region of transistors. Then, the surface of the layer 7 is oxidized by applying heat to form the $SiO_2$ film 8, on which the $Si_3N_4$ film 9 is formed by the known CVD method.

Figure 3B:
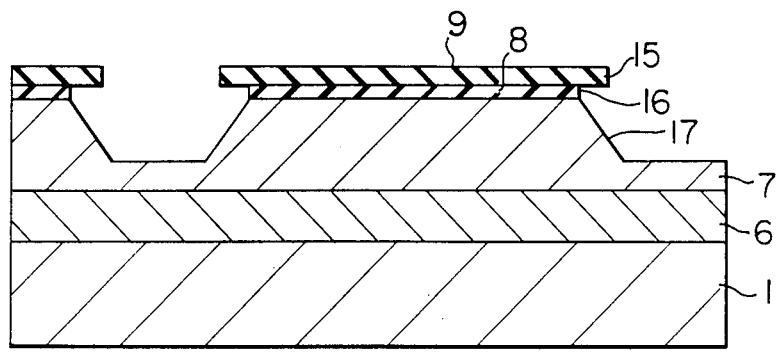

Subsequently, the $Si_3N_4$ film 9 is selectively etched away by the well known etching process, and the exposed portion of the $SiO_2$ film 8 is further over-etched away to leave a pent roof 15 of $Si_3N_4$ as shown in FIG. 3b. In this case, the amount of side-etching of the $SiO_2$ film 8 is preferably 0.3 to 1.0 μm. Then, by using a well known alkaline etchant such as KOH or hydrazine the Si epitaxial layer 7 is etched isotropically to form a slope 17 beginning from the ends 16 of the $SiO_2$ film 8 as illustrated. This isotropic etching is continued until the (111) slope 17 exceeds the end of the roof 15. That is, since the (111) slope 17 is at 55° relative to the main surface (100), the depth of etching is given by d·tan 55°(=1.43d) or above where d is the amount of side-etching of the $SiO_2$ film 8.

Figure 3C:
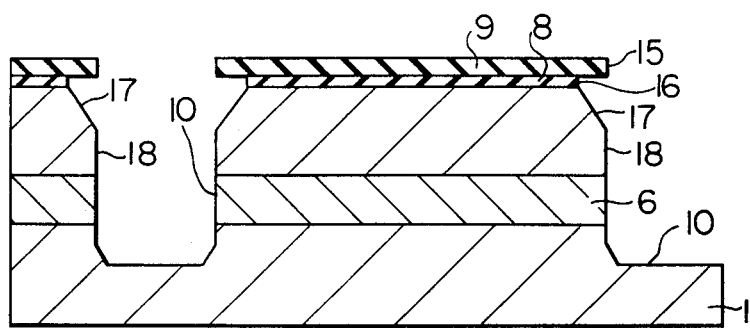

Subsequently, by the reactive spatter etching technique with use of the mixture of $CCl_4$ and $O_2$ gas, the exposed portion of the Si epitaxial layer 7, buried layer 6 and Si substrate 1 are selectively etched away with the mask of the $Si_3N_4$ film 9 as shown in FIG. 3c, so as to form a groove 18 of substantially vertical side wall which penetrates the collector buried layer 6 into the Si substrate 1.

Figure 3D:
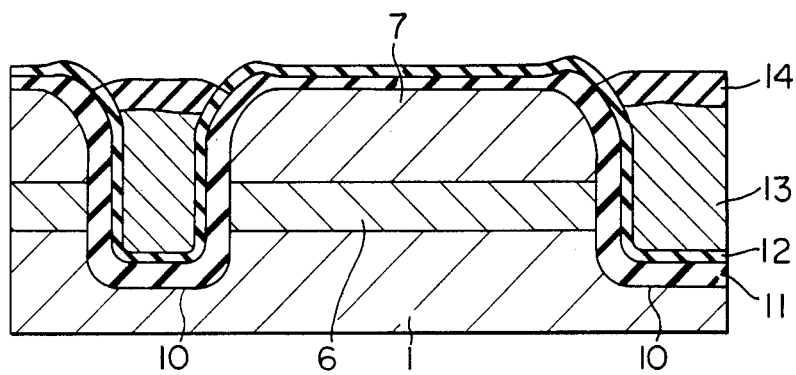

Then, in order to prevent the generation of channeling, an impurity material (boron) having opposite conductivity to that of the buried layer 6 is introduced into the bottom surface of the groove 18 by ion implantation. After annealed in a nitrogen atmosphere, the exposed portion of groove 10 is selectively oxidized with use of the mask of $Si_3N_4$ film 9, to have the thick $SiO_2$ film (about 0.3 to 1.0 μm thick) formed over the surface of the groove, as shown in FIG. 3d. After the mask of the $Si_3N_4$ film 9 is removed, the $Si_3N_4$ film 12 is again deposited over the entire substrate. The $Si_3N_4$ film 12 thus formed has a good effect of preventing the lateral oxidization upon subsequent oxidizing process, and the crystal defect from occurring, but it can be omitted because the isolation can be achieved without the formation of the $Si_3N_4$ 12. Thereafter, a polycrystalline Si 13 is buried in the groove 10, and the exposed portion is oxidized to form thereon a $SiO_2$ film 14. Thus, the isolation is achieved as shown in FIG. 3d.

As is apparent from FIG. 3d, if the buried polycrystalline Si 13 is shallow, no steep-edge step is formed at the mouth of the groove 10 because the slope of groove 10 is gentle. Moreover, since windows can be formed in self-alignment on the base and emitter regions by use of thick $SiO_2$ film 11, precise working is advantageously performed.

While in this embodiment as shown in FIGS. 3a to 3d the isotropic etching of Si with use of etchant, combined with the dry etching is performed to form the groove 18 of Y-shaped section, such groove 10 can be formed by only the dry etching the condition of which is controlled.

Figure 4:
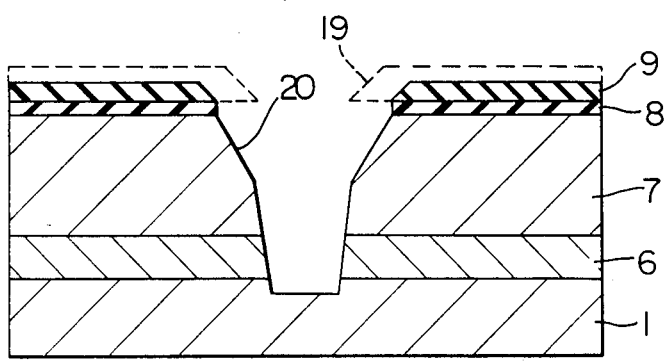
FIG. 4 is a cross-sectional view of another embodiment of the invention.

Specifically, as shown in FIG. 4, the $Si_3N_4$ film 9 to be used as an etching mask is provided at its ends with a taper 19, and the initial etching is performed under the condition that the ratio of the etching speed for Si to that for $Si_3N_4$, or the ratio ($Si/Si_3N_4$) is a large value (5 or above). Then, etching is performed under a small value (about 1 to 5) of $Si/Si_3N_4$, so that the $Si_3N_4$ film 9 is gradually etched at its ends and at the same time a gentle slope 20 is gradually formed at the upper side wall of the groove as a result of the gradual etching of the $Si_3N_4$ mask 9, as shown in FIG. 4.

In addition, the side-etching of the $SiO_2$ film 8 and the etching of Si with fluoric acid-nitric acid are alternately performed to form a groove having an arbitrary slope although steps are slightly caused. This dry processing can be practically used.

While in the above embodiment as shown in FIGS. 2, 3a to 3d, and 4 the polycrystalline silicon Si is buried in the groove 10 or 18, other materials such as dielectric materials of $SiO_2$, $Si_3N_4$ and the like, or high polymer materials can be used as a buried material in the groove 10 or 18.

While in the above embodiments the $SiO_2$ film 11 and $Si_3N_4$ film 12 are used as a mask for the groove 10 or 18, this invention is not limited to these films, but can of course use other two different films with different etchant-resistance properties.

EMBODIMENT 2

Although various elements can be formed in the regions isolated by the Y-shaped groove 10, this embodiment shows the formation of a bipolar transistor.

Figure 5A:
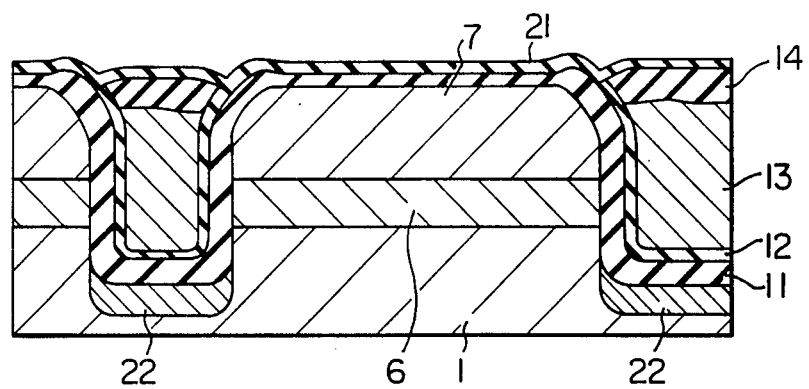
FIGS. 5a to 5b, 6a to 6b and 7a to 7c are flow diagrams of other different embodiments of the invention.

By the same processes as in the embodiment 1, the Y-shaped groove 10 is formed as shown in FIGS. 3a to 3d. Then, after the exposed portion of the $Si_3N_4$ film 12 is removed, a $Si_3N_4$ film 21 is deposited over the entire surface as shown in FIG. 5a by the known CVD process. In FIG. 5a, reference numeral 22 represents a channel stop layer formed on the bottom of the groove 18 by the ion implantation process for the purpose of preventing the generation of channeling.

Figure 5B:
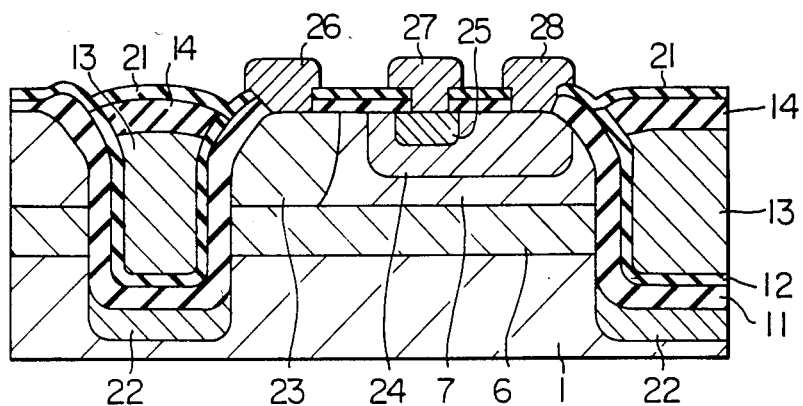

Subsequently, by known diffusion and ion implantation process, are formed in the epitaxial layer 7 a collector channel region 23, a base region 24 and an emitter region 25. Then, a collector electrode 26, an emitter electrode 27 and a base electrode 28 are formed by the well known photoetching process, thus building up a bipolar transistor as shown in FIG. 5b.

In the bipolar integrated circuit formed according to the embodiment 2, the separation distance between elements is ⅓ or below of that in the conventional integrated circuit, and thereby the integration degree of the bipolar integrated circuit is improved twice or more. In addition, no great step and less occurence of crystal defect lead to high yield of good transistors.

EMBODIMENT 3

A groove of a Y-shaped cross section is formed as follows.

Figure 6A:
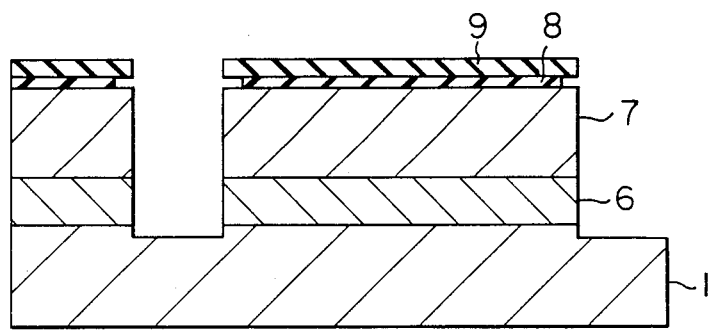
Figure 6B:
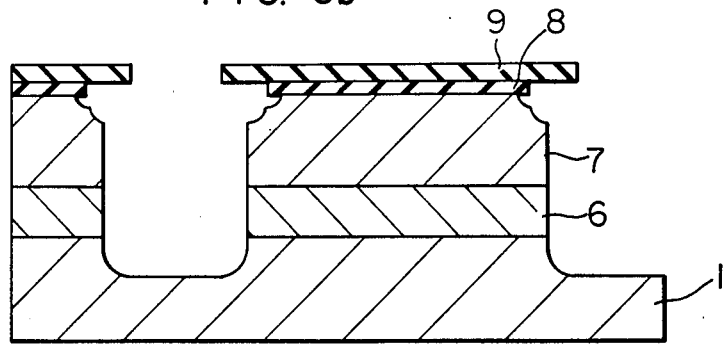

First referring to FIG. 3a, the $SiO_2$ film 8 and $Si_3N_4$ film 9 are deposited on the Si epitaxial layer 7 in turn. Then, part of the $SiO_2$ film 8 and $Si_3N_4$ film 9 in which a groove is to be formed is etched away so that the corresponding surface of the Si epitaxial layer 7 is exposed. As shown in FIG. 6a, by reactive spatter etching, the exposed layer 7 is vertically etched away to the depth of about 2.5 $\mu$m and the $SiO_2$ film 8 is further laterally etched away to about 0.3 $\mu$m in length. Then, by use of an etchant containing fluoric acid-nitric acid, the films are etched about 0.2 $\mu$m. The exposed surface of silicon is etched isotropically in the vertical and horizontal directions. The $SiO_2$ film 8 is again laterally etched away to about 0.2 $\mu$m, and by the above etchant are isotropically etched away the corresponding films so that a groove, as shown in FIG. 6b, is formed having stepped gentle slopes on its upper side wall with slight steps. the steps are reduced in their height by further isotropic etching and finally removed to flatness thereby.

Even if the corners of the bottom of the groove are substantially at right angles, there is no trouble in practice. As shown in FIG. 6b, the round corners are effective to disperse the stress caused within the semiconductor substrate 1, providing excellent results.

EMBODIMENT 4

This embodiment employs only $SiO_2$ for filling the inside of the groove. After the groove 10 of a Y-shaped section is formed by the processes as shown in FIGS. 3a to 3c, the thick $SiO_2$ film 11 and the $Si_3N_4$ film 12 are formed as shown in FIG. 3d. These processes are the same as in Embodiment 1.

Then, after $SiO_2$ is filled in the groove 10 by the known CVD process, a bipolar transistor is built up in the substrate in the same way as in the Embodiment 2.

In this embodiment 4, since insulating material of $SiO_2$ is filled in the groove, capacitance produced by the conductors for interconnection, i.e. so-called wiring capacitance is reduced to ⅓ or below of that in the prior art, and the operating speed of the bipolar integrated circuit is improved 1.5 times or more.

EMBODIMENT 5

In the above embodiments, to form gentle slopes at the upper side wall of the groove 10, side-etching is performed on the $SiO_2$ film, thus extending the mouth of the groove to be larger than the opening of the mask to be used.

This embodiment 5 does not expand the width of the groove to be larger than the size of the opening of the mask, but provides a slope at the upper side wall of the groove to thereby form a fine isolating groove effective for flattening.

Figure 7A:
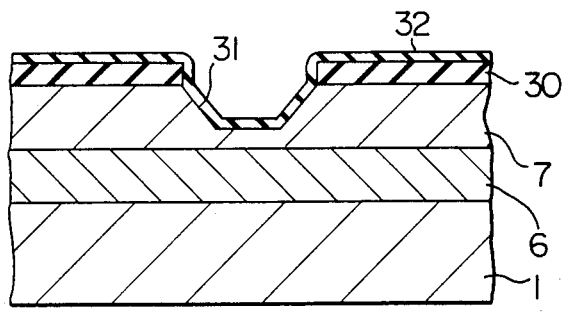
Figure 7B:
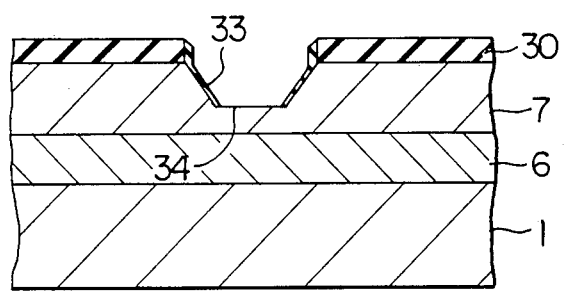
Figure 7C:
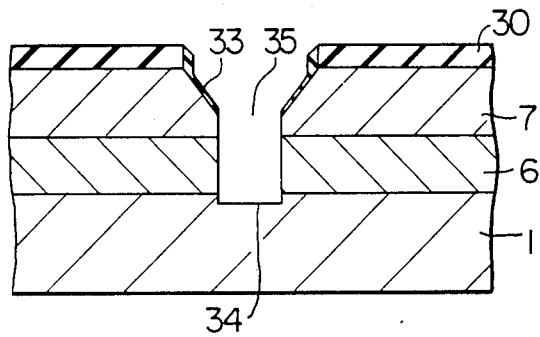

First, on the (100) oriented Si substrate 1, the collector buried layer 6 and epitaxial Si layer 7 are formed in the same way as in Embodiment 1, and an etching mask 30 formed of $SiO_2$ or $Si_3N_4$ is formed as shown in FIG. 7a. Then, the wet etching with use of hydrazine solution and plasma etching with use of $CCl_4$ gas are performed to etch along a (111) surface 31, forming a groove having slopes descending inwards from the end of the opening of the mask 30. Thereafter, by the known CVD process, is deposited over the entire surface a $SiO_2$ film 32. The $SiO_2$ film 32 thus deposited is etched to an extent of its film thickness by the spatter etching process with the result that since the thickness is reduced by the film thickness in the depth direction or vertical direction, the $SiO_2$ on the horizontal plane is completely removed but the $SiO_2$ on the slopes 31 not completely removed, leaving a remaining portion 33 as shown in FIG. 7b. Since the plane (111) is sloped at 55° with respect to the plane (100), the $SiO_2$ film has a 1.74-fold (1/cos 55°-fold) thickness in the depth direction. Thus, even after etching, the $SiO_2$ film has a 0.74-fold thickness in the depth direction, or the remaining portion 33 is left on the slope. Since the Si surface is exposed at the bottom, 34 of the groove, the Si is etched with the mask of the remaining portion 33 by the reactive spatter etching to form an exposed bottom portion 34 in the groove as shown in FIG. 7c. The etchant used for the reactive spatter etching on Si is the mixture of $CCl_4$ and 20% of $O_2$ of pressure 5Pa under high frequency power density of 0.4 W/cm². At this time, the Si is etched at the selecting ratio of 20 with respect to $SiO_2$ and not etched in the lateral direction.

The etching mask 30 may be $Si_3N_4$, $Al_2O_3$ or the like other than $SiO_2$, or may be formed by heating to oxidize Si into $SiO_2$ without direct deposition. That is, whatever is formed on the Si to serve as an etching mask for Si may be used as the mask 30. The etching process for this film may be any one which attacks the film only in the depth direction (for example, spatter etching with use of Ar gas or reactive spatter etching with use of freon gas).

EMBODIMENT 6

This embodiment is to form grooves of different depths in accordance with the invention.

Figure 8:
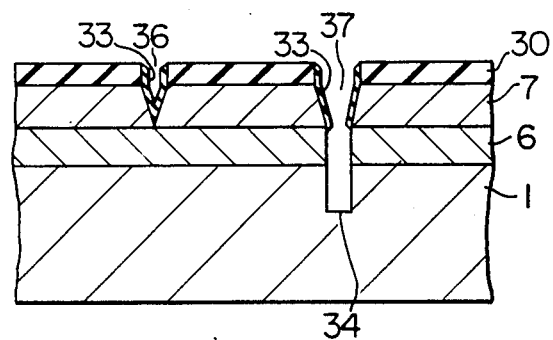
FIG. 8 is a cross-sectional view of still another embodiment of the invention.

For a fine groove 36 as shown in FIG. 8, when etching is performed to leave the Si (111) plane, the side walls of the groove are connected at their skirts to form a V-shaped groove because of small width of the groove with the result that only the remaining portion 33 on the slopes covers the entire wall of the groove. On the hand, for a wide groove 37, the remaining portion 33 covers only the slopes and the bottom 34 of the groove is exposed similarly as in the embodiment 5. Under this condition, when reactive spatter etching is performed on Si the V-shaped fine groove 36 is unchanged but the wide groove 37 is changed to a Y-shaped groove deeper than the V-shaped fine groove 36, as shown in FIG. 8.

According to this embodiment, grooves of different depths can be formed from grooves of different widths at the same time.

For etching process for making slopes on the side walls of the groove, when chloride gas such as $CCl_4$, $PCl_3$, $SiCl_4$ or the like is used to perform reactive spatter etching, the (111) plane is not left completely so that the slopes increase their angle with respect to the vertical. Thus, under different etching conditions the slope angle and be changed in the range from 55° to 90° and therefore the width of the groove can be made finer as shown in FIG. 8. If the depth of the shallow groove 36 is represented by D, the width, L of the shallow groove 36 can be changed in the range from 0 to 1.4D. The width of the deep groove 37 can be changed in a wider range than that of L. Thus, in accordance with the invention, a fine groove of a V-shaped section the width of which is almost not limited, and a wider groove of a Y-shaped section the depth of which is larger than that of the fine groove can be formed at the same time.

What is claimed:

1. A semiconductor integrated circuit device having a plurality of elements formed in a surface region of a semiconductor substrate to be isolated from each other by a groove formed on said substrate, said groove having a gentle slope at its upper side wall to provide a gentle slope at the surface region of the substrate and a steep slope at its lower side wall, and the inside of said groove being filled with an insulating material, wherein the upper and lower slopes of said groove are at about 30° to 65° and 70° to 90°, respectively with respect to the main surface of said semiconductor substrate.

2. A semiconductor device according to claim 1, wherein said insulating material is filled in the groove the inside wall of which is deposited in advance thereon with an insulating film.

3. A semiconductor device according to claim 2 or 1, wherein said insulating material is selected from a group of $SiO_2$, $Si_3N_4$, $Al_2O_3$ or phosphosilicate glass.

4. A semiconductor integrated circuit device having a plurality of elements formed on a surface region of a semiconductor substrate to be isolated from each other by a groove formed on said substrate, said groove having a gentle slope at its upper side wall to provide a gentle slope at the surface region of the substrate and a steep slope at its lower side wall, said groove being filled with a polycrystalline silicon through an insulating film deposited on the inner surface of said groove, wherein the upper and lower side walls of said groove are at an angle in the range of about 30° to 65°, and at an angle in the range of about 70° to 90°, respectively with respect to the main surface of said semiconductor substrate.

5. A semiconductor device according to claim 4, wherein said insulating film includes a single layer.

6. A semiconductor device according to claim 4, wherein said insulating film includes two layers.

7. A semiconductor device according to claim 6, wherein said two layers are made of $SiO_2$ and $Si_3N_4$ respectively.

8. A semiconductor device according to claim 4, wherein said insulating film is deposited on the side wall and bottom of said groove.

9. A semiconductor device according to claim 4, wherein said insulating film is deposited only on the side wall of said groove.

10. A semiconductor device according to claim 1, wherein said groove is provided between said elements.

11. A semiconductor device according to claim 1, wherein the gentle and steep slopes of said groove are directly contiguous to each other without an intermediate portion therebetween parallel to a surface of said semiconductor substrate.

12. A semiconductor device having a pluraliy of elements formed in a surface region of a semiconductor substrate to be isolated from each other by a groove formed on said substrate, said groove having a gentle slope at its upper side wall and a steep slope at its lower side wall, and the inside of said groove being filled with an insulating material, wherein the upper and lower slopes of said groove are at about 30° to 65° and 70° to 90°, respectively with respect to the main surface of said semiconductor substrate.

13. A semiconductor device having a plurality of elements formed on a surface region of a semiconductor substrate to be isolated from each other by a groove formed on said substrate, said groove having a gentle slope at its upper side wall and a steep slope at its lower side wall, said groove being filled with a polycrystalline silicon through an insulating film deposited on the inner surface of said groove, wherein the upper and lower side walls of said groove are at an angle in the range of about 30° to 65°, and at an angle in the range of about 70° to 90°, respectively with respect to the main surface of said semiconductor substrate.

14. A semiconductor device according to claim 12, wherein said insulating material is filled in the groove, the inside wall of which is deposited in advance thereon with an insulating film.

15. A semiconductor device according to claim 12, wherein said insulating material is selected from a group of $SiO_2$, $Si_3N_4$, $Al_2O_3$ or phosphosilicate glass.

16. A semiconductor device according to claim 14, wherein said insulating material is selected from a group of $SiO_2$, $Si_3N_4$, $Al_2O_3$ or phosphosilicate glass.

17. A semiconductor device according to claim 13, wherein said insulating film includes a single layer.

18. A semiconductor device according to claim 13, wherein said insulating film includes two layers.

19. A semiconductor device according to claim 18, wherein said two layers are made of $SiO_2$ and $Si_3N_4$, respectively.

20. A semiconductor device according to claim 13, wherein said insulating film is deposited on the side wall and bottom of said groove.

21. A semiconductor device according to claim 13, wherein said insulating film is deposited only on the side wall of said groove.

22. A semiconductor device according to claim 1, wherein the maximum width of said groove is less than the depth of said groove.

23. A semiconductor device according to claim 4, wherein the maximum width of said groove is less than the depth of said groove.

* * * * *